United States Patent
Shah et al.

(10) Patent No.: US 12,243,602 B2
(45) Date of Patent: *Mar. 4, 2025

(54) METHOD, DEVICE, AND CIRCUIT FOR HIGH-SPEED MEMORIES

(71) Applicant: Taiwan Semiconductor Manufacturing Company, Ltd., Hsinchu (TW)

(72) Inventors: Jaspal Singh Shah, Ottawa (CA); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/411,822

(22) Filed: Jan. 12, 2024

(65) Prior Publication Data

US 2024/0153573 A1 May 9, 2024

Related U.S. Application Data

(63) Continuation of application No. 17/834,122, filed on Jun. 7, 2022, now Pat. No. 11,894,086.

(Continued)

(51) Int. Cl.
*G11C 29/12* (2006.01)
*G11C 29/36* (2006.01)
*G11C 29/46* (2006.01)

(52) U.S. Cl.
CPC .... *G11C 29/1201* (2013.01); *G11C 29/12015* (2013.01); *G11C 29/36* (2013.01); *G11C 29/46* (2013.01); *G11C 2029/3602* (2013.01)

(58) Field of Classification Search
CPC .......... G11C 29/1201; G11C 29/12015; G11C 29/36; G11C 29/46; G11C 2029/3602
See application file for complete search history.

(56) References Cited

U.S. PATENT DOCUMENTS 9,798,352 B1 10/2017 Majumdar et al.
10,520,547 B2 12/2019 Sarda
(Continued)

OTHER PUBLICATIONS

Non-Final Office Action on U.S. Appl. No. 17/834,122 DTD Jun. 8, 2023.

(Continued)

*Primary Examiner* — Mohammed A Bashar
(74) *Attorney, Agent, or Firm* — FOLEY & LARDNER LLP (57) ABSTRACT

In some aspects of the present disclosure, a memory device is disclosed. In some aspects, the memory device includes a plurality of memory cells arranged in an array, an input/output (I/O) interface connected to the plurality of memory cells to output data signal from each memory cell, and a control circuit. In some embodiments, the control circuit includes a first clock generator to generate a first clock signal and a second clock signal according to an input clock signal and a chip enable (CE) signal and provide the first clock signal to the plurality of memory cells. In some embodiments, the control circuit includes a second clock generator to generate a third clock signal according to the input clock signal and a DFT (design for testability) enable signal. In some embodiments, the control circuit generates an output clock signal according to the second clock signal or the third clock signal.

20 Claims, 7 Drawing Sheets

100

Related U.S. Application Data (60) Provisional application No. 63/303,638, filed on Jan. 27, 2022.

(56) References Cited

U.S. PATENT DOCUMENTS

| | | | |
|---|---|---|---|
| 10,685,730 B1 | 6/2020 | Shah et al. | |
| 2015/0316605 A1* | 11/2015 | Deutsch | G11C 29/56004 702/117 |
| 2018/0365358 A1* | 12/2018 | Clemow | G06F 30/3308 |
| 2020/0135289 A1* | 4/2020 | Ng | G11C 29/789 |

OTHER PUBLICATIONS

Notice of Allowance on U.S. Appl. No. 17/834,122 DTD Oct. 5, 2023.

Office Action issued in connection with Taiwan Appl. No. 111146740 dated Nov. 2, 2023.

* cited by examiner

METHOD, DEVICE, AND CIRCUIT FOR HIGH-SPEED MEMORIES

CROSS-REFERENCE TO RELATED APPLICATION

This application is a continuation application of U.S. patent application Ser. No. 17/834,122, filed Jun. 7, 2022, which claims priority to U.S. Provisional Patent Application No. 63/303,638, filed Jan. 27, 2022, each of which is incorporated herein in its entirety for all purposes.

BACKGROUND

Today's system-on-a-chip (SOC) designs can contain large numbers of memories. These memories may occupy most of the portion of SOCs and any failure in memory may affect the SOC operation. Therefore, a Design for Testability (DFT) approach testing may be used to screen out damaged chips. DFT can be implemented as a segment of a circuit on a chip, board, or system that is utilized to test the circuit itself.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a memory circuit, method, and device employing separate clock generators for mission mode operation and design for testability (DFT) operation. Advantageously, embodiments of the memory circuit, method, and device improve system level power and performance as sub-blocks are individually tuned. Power, performance, and area (PPA) can be independently tuned for DFT operation without impacting mission mode. Likewise, PPA can be independently tuned for mission mode without impacting DFT mode.

The present disclosure provides various embodiments of a memory circuit, method, and device enabling or disabling the global clock within the global control circuit. Beneficially, embodiments of the memory circuit, method, and device improve setup and hold time, DFT cycle time, and enable a higher frequency of operation. Particularly in applications where routing between memory banks and the global control circuit is very long, the embodiments of the memory circuit, method, and device avoid a long setup and hold time for the global clock by enabling or disabling the global clock within the global control circuit.

Figure 1:
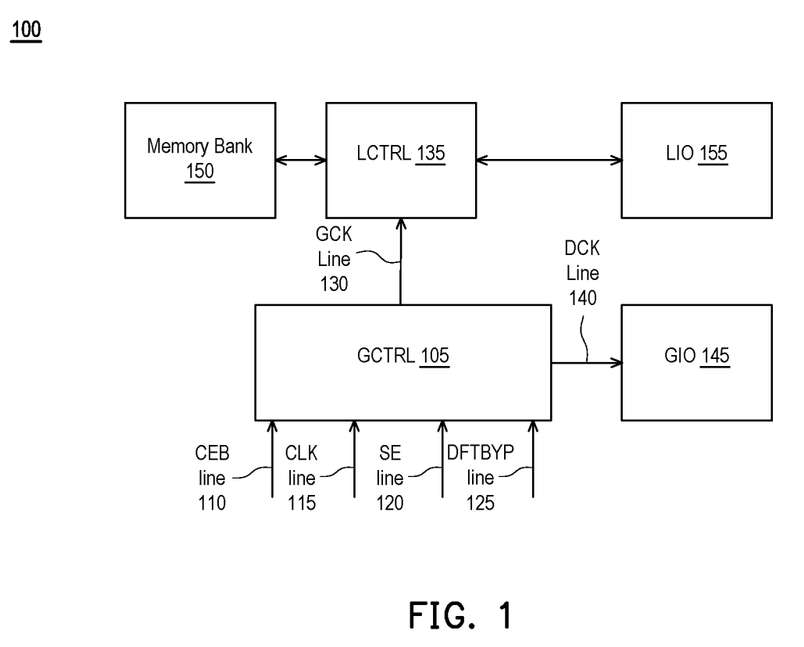
FIG. 1 illustrates a block diagram of a memory system, in accordance with some embodiments of the present disclosure.

FIG. 1 illustrates a block diagram of a memory system 100, in accordance with some embodiments of the present disclosure. The memory system 100 may be referred to as a memory device. The memory system 100 includes a global control circuit (GCTRL) 105. In some embodiments, the GCTRL 105 performs separate clock generation for mission mode operation and for design for testability (DFT) operation. Mission mode operation can also be referred to as normal operation. The GCTRL 105 may be referred to as a control circuit.

The GCTRL 105 includes a number of inputs. The GCTRL 105 receives a chip enable, low-active (CEB) signal via a CEB line 110. The chip enable, low-active signal can be referred to as a chip enable (CE) signal. The GCTRL 105 receives a clock (CLK) signal via a CLK line 115. The GCTRL 105 receives a scan enable (SE) signal via an SE line 120. The GCTRL 105 receives a DFT bypass (DFTBYP) signal via a DFTBYP line 125. Either of the DFTBYP signal or the SE signal can be used to enable DFT operation. The DFTBYP signal and the SE signal can be referred to as DFT mode signals.

A signal generated from an "OR" operation of the DFTBYP signal and the SE signal can be referred to as a DFT enable (DFTEN) signal. In some embodiments, in response to the DFTEN signal being in a first logic state, the memory device 100 is in DFT mode. In some embodiments, in response to the DFTEN signal being in a second logic state, the memory device 100 is in mission mode. In some embodiments, the first logic state is a high logic state (e.g., 1, 1V, etc.) and the second logic state is a low logic state (e.g., 0, 0V, etc.).

The GCTRL 105 includes a number of outputs. The GCTRL 105 provides a global clock (GCK) signal via a GCK line 130 that couples the GCTRL 105 to the LCTRL 135. In some embodiments, GCK is enabled during mission mode. The memory system 100 includes a local control circuit (LCTRL) 135. In some embodiments, the LCTRL 135 receives the GCK signal via the GCK line 130. In some embodiments, the GCK line 130 is long enough that it is advantageous to enable or disable the GCK signal in the GCTRL 105 in order to not incur the delay that would result from sending the GCK signal to the LCTRL 135 and enabling or disabling the GCK signal in the LCTRL 135. For example, a length of the GCK line 130 can be greater than 10 micrometers (microns), 100 microns, 200 microns, or any of various distances while remaining in the scope of the present disclosure.

The GCTRL 105 provides a DFT-or-mission mode clock (DCK) signal via a DCK line 140. The DCK signal is enabled during DFT mode or during mission mode. In some embodiments, DFT mode requires disabling GCK and GCK dependent signals such as word line, bit line, select line, and read/write related signals. The memory system 100 includes a global input/output circuit (GIO) 145. The GIO 145 receives the DCK line 140 via the DCK line 140.

Table 1 shows an exemplary combination of signals that can enable the GCK and DCK signals. In some embodiments, a "1" indicates to enable and a "0" indicates to disable.

TABLE 1

| CLK | CEB | DFTEN | GCK | DCK |
|---|---|---|---|---|
| 1 | 0 | 0 | 1 | 1 |
| 1 | 0 | 1 | 0 | 1 |
| 1 | 1 | 0 | 0 | 0 |
| 1 | 1 | 1 | 0 | 1 |

The memory system 100 includes a memory bank 150. The memory bank 150 can include a number of memory cells. The memory cells can operate in accordance with word line, bit line, select line, and read/write related signals. Although only one memory bank 150 is shown, the memory system 100 can include two or more memory banks 150 without departing from the scope of the present disclosure. The memory system 100 includes a local input/output circuit (LIO) 155. The LIO 155 can perform IO operations for the memory bank 150. In some embodiments, the LIO 155 outputs data signal from the memory bank 150. In some embodiments, a distance between the GCTRL 105 and each of the LCTRL 135, the memory bank 150, and the LIO 155 is greater than 10 microns, 100 microns, 200 microns, or any of various distances while remaining in the scope of the present disclosure. In some embodiments, the LIO 155 is referred to as the I/O interface. Although only one LIO 155 is shown, the LIO 155 can include two or more LIO 155 without departing from the scope of the present disclosure. In some embodiments including two or more LIO 155, each LIO 155 can perform IO operations for a corresponding memory bank 150. In some embodiments, at least one of the memory bank 150 or the LIO 155 receives the GCK signal via the GLCK line 130. In some embodiments, a distance between the GCTRL 105 and each of the LCTRL 135, the memory bank 150, and the LIO 155 can increase or decrease by orders of magnitude. Such length is determined by the size of the memory bank 150.

Figure 2A:
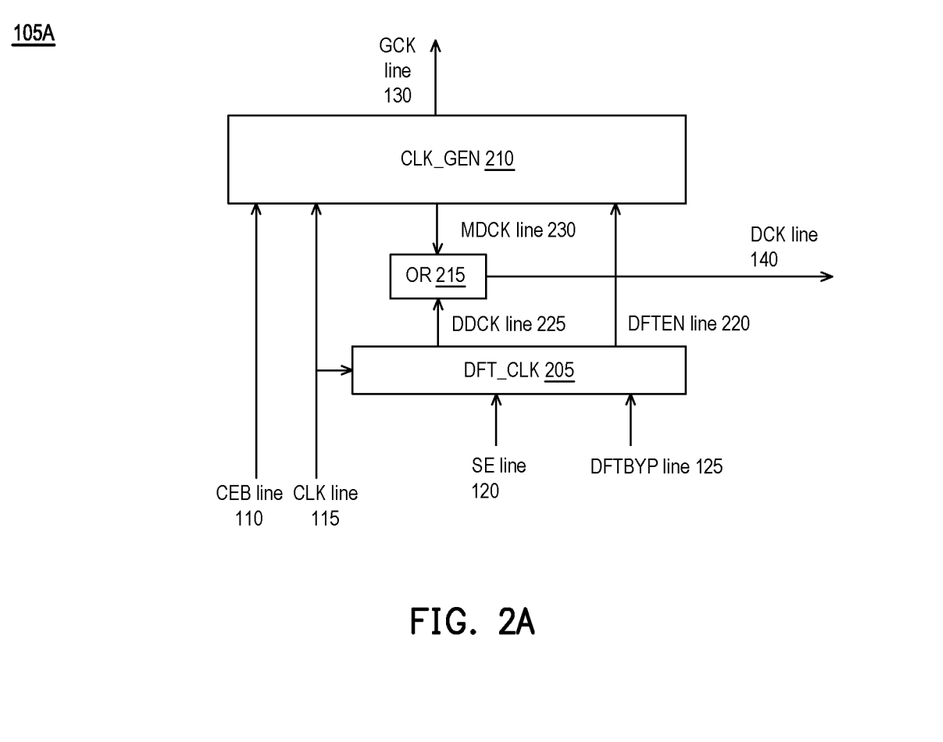
FIGS. 2A-2D illustrate block diagrams of global control circuit, in accordance with some embodiments of the present disclosure.

FIGS. 2A-2D illustrate block diagrams of the GCTRL 105, in accordance with some embodiments of the present disclosure. FIG. 2A illustrates a block diagram of the GCTRL 105A, which is one implementation of the GCTRL 105. The GCTRL 105A includes a DFT mode clock (DDCK) generator (DFT_CLK) 205. The DFT_CLK 205 is designed, configured, and operated to generate a DDCK. The DFT_CLK 205 receives the CLK signal, the SE signal, and the DFTBYP signal via the CLK line 115, the SE line 120, and the DFTBYP line 125, respectively. In some embodiments, the DFT_CLK 205 provides the DDCK signal and the DFTEN signal via the DDCK line 225 and the DFTEN line 220, respectively. The circuit that generates the DDCK signal is discussed further with respect to FIG. 3. The DFT_CLK 205 can generate the DFTEN signal by performing a logical "OR" operation on the SE signal and the DFTYP signal.

The GCTRL 105A includes a mission mode clock generator (CLK_GEN) 210. The CLK_GEN 210 is designed, configured, and operated to generate a mission mode clock. The CLK_GEN 210 receives the CLK signal, the CE signal, and the DFTEN signal via the CLK line 115, the CEB line 110, and the DFTEN line 220, respectively. The CLK_GEN 210 provides the GCK signal and the mission mode clock (MDCK) signal via the GCK line 130 and the MDCK line 230, respectively. GCK signal is a mission mode clock that is sent to other circuit blocks such as the LCTRL 135 and the MDCK signal is a mission mode signal that is used to generate a signal that is sent to a global circuit such as the GIO. In some embodiments, CLK_GEN 210 disables the GCK signal and the MDCK signal in response to receiving an enabled DFTEN signal.

The GCTRL 105A includes an OR gate 215. The OR gate 215 receives the DDCK signal and the MDCK signal via the DDCK line 225 and the MDCK line 230, respectively. The OR gate 215 performs an OR operation on the DDCK signal and the MDCK signal to generate the DCK signal. The OR gate 215 provides the DCK signal via the DCK line 140. Advantageously, using an OR gate to generate the DCK signal from the MDCK signal and the DDCK signal incurs less latency than using multiple logic gates in series to generate the DCK signal from the MDCK signal and the DDCK.

Table 2 shows an exemplary combination of signals that can enable the GCK DDCK, MDCK, and DCK signals.

TABLE 2

| CLK | CEB | DFTEN | GCK | DDCK | MDCK | DCK |
|---|---|---|---|---|---|---|
| 1 | 0 | 0 | 1 | 0 | 1 | 1 |
| 1 | 0 | 1 | 0 | 1 | 0 | 1 |
| 1 | 1 | 0 | 0 | 0 | 0 | 0 |
| 1 | 1 | 1 | 0 | 1 | 0 | 1 |

In some embodiments, in response to the DFTEN signal (e.g., the "OR" operation of the DFTBYP signal and the SE signal) being in a first logic state, the memory device 100 is in DFT mode, and the DCK signal generated by the GCTRL 105 follows the DDCK signal. In some embodiments, in response to the DFTEN signal being in a second logic state, the memory device 100 is in mission mode, and the DCK signal generated by the GCTRL 105 follows the MDCK signal. In some embodiments, the first logic state is a high logic state (e.g., "1", enable, etc.) and the second logic state is a low logic state (e.g., "0", disable, etc.).

Figure 2B:
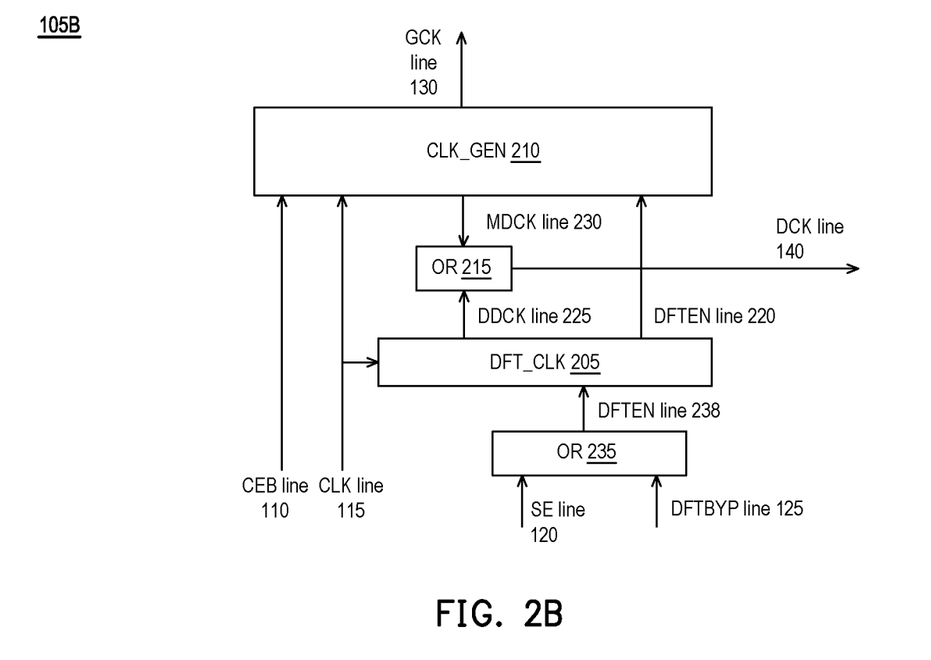

FIG. 2B illustrates a block diagram of the GCTRL 105B, which is one implementation of the GCTRL 105. GCTRL 105B can be one implementation of GCTRL 105A. GCTRL 105B includes an OR gate 235. The OR gate 215 receives the SE signal and the DFTYP signal via the SE line 120 and the DFTYP line 125, respectively. The OR gate 215 performs an OR operation on the SE signal and the DFTYP signal to generate the DFTEN signal. In some embodiments, the OR gate 215 provides the DFTEN signal to the DFT_CLK 205 via the DFTEN line 238. In some embodiments, the DFT_CLK 205 provides a buffered DFTEN signal to the CLK_GEN 210 via the DFTEN line 220. Operation of GCTRL 105B is different from operation of GCTRL 105A in that, in GCTRL 105B, the signals SE and DFTBYP are processed by OR logic that is external to the DFT_CLK 205, whereas, in GCTRL 105A, the signals SE and DFTBYP are processed by OR logic that is internal to the DFT_CLK 205.

Figure 2C:
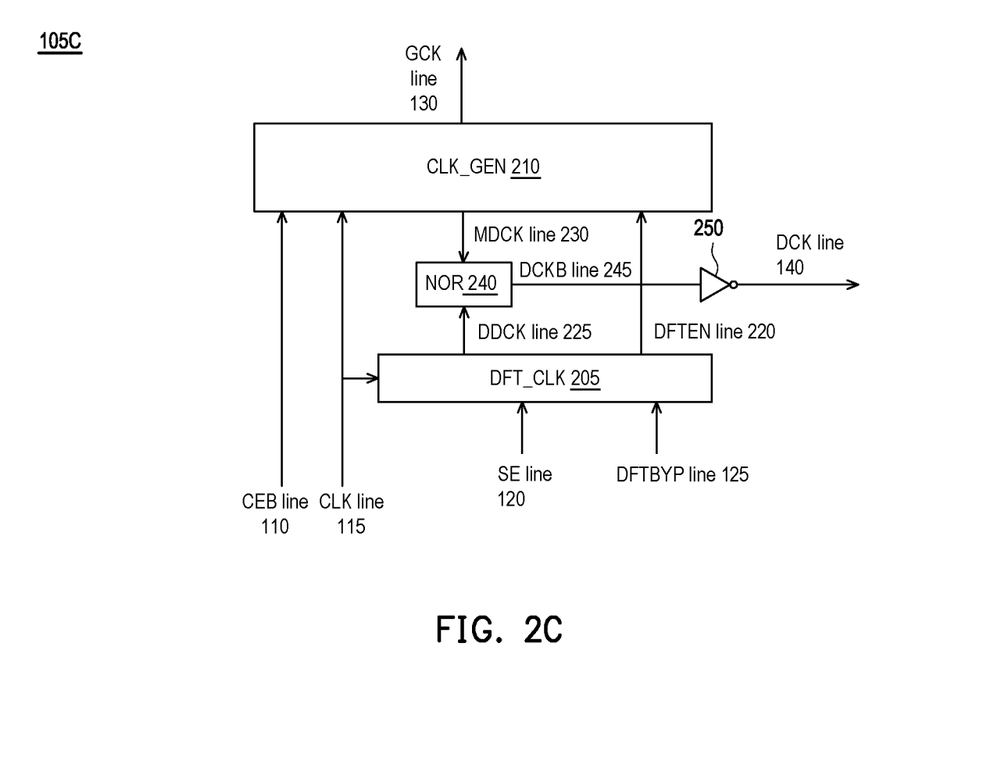

FIG. 2C illustrates a block diagram of the GCTRL 105C, which is one implementation of the GCTRL 105. The GCTRL 105C is similar to the GCTRL 105A of FIG. 2A except that the GCTRL 105C includes an NOR gate 240 and an inverter 250 instead of the OR gate 215. An advantage to using the NOR gate 240 and the inverter 250 is that the NOR gate 240 can be a first size and the inverter 250 can be sized based on a load that the GCTRL 105C is coupled to via the DCK line 140. The first size may be a fixed size and/or a standard size. In some embodiments, the OR gate 215 of FIG. 2A is implemented as the NOR gate 240 and the inverter 250.

The NOR gate 240 receives the DDCK signal and the MDCK signal via the DDCK line 225 and the MDCK line 230, respectively. The NOR gate 240 performs an NOR operation on the DDCK signal and the MDCK signal to generate the DCKB signal. The NOR gate 240 provides the DCKB signal via the DCKB line 245. The inverter 250 receives the DCKB signal via the DCKB line 245. The inverter 250 performs a NOT operation on the DCKB signal to generate the DCK signal. The inverter 250 provides the DCK signal via the DCK line 140.

Figure 2D:
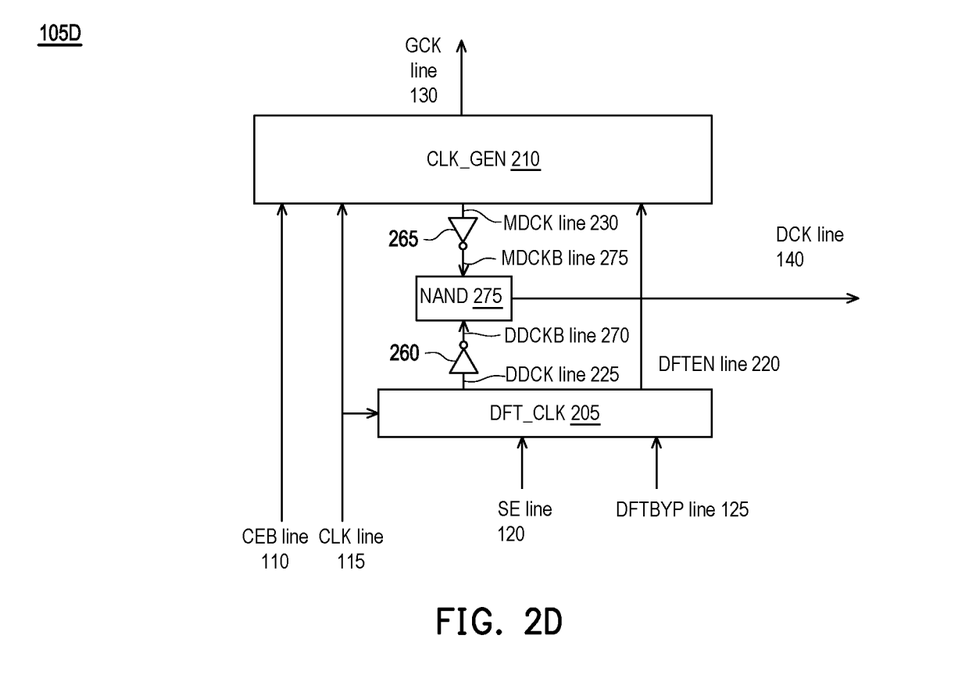

FIG. 2D illustrates a block diagram of the GCTRL 105D, which is one implementation of the GCTRL 105. The GCTRL 105D is similar to the GCTRL 105A of FIG. 2A except that the GCTRL 105D includes an inverter 260, an inverter 265, and a NAND gate 275 instead of the OR gate 215. An advantage to using the inverter 260, the inverter 265, and the NAND gate 275 is that NAND logic is low-cost, high-density, and has high-speed program/erase applications. In some embodiments, the OR gate 215 of FIG. 2A is implemented as the inverter 260, the inverter 265, and the NAND gate 275.

The inverter 260 receives the DDCK signal via the DDCK line 225. The inverter 260 performs a NOT operation on the DDCK signal to generate the DDCKB signal. The inverter 260 provides the DDCKB signal via the DDCKB line 270. The inverter 265 receives the MDCK signal via the MDCK line 230. The inverter 265 performs a NOT operation on the MDCK signal to generate the MDCKB signal. The inverter 265 provides the MDCKB signal via the MDCKB line 275.

The NAND gate 275 receives the DDCKB signal and the MDCKB signal via the DDCKB line 270 and the MDCKB line 275, respectively. The NAND gate 275 performs a NAND operation on the DDCKB signal and the MDCKB signal to generate the DCK signal. The NAND gate 275 provides the DCK signal via the DCK line 140. Operation of GCTRL 105D is different from operation of GCTRL 105A in that, in GCTRL 105D, the signals DDCK and MDCK are inverted and processed by NAND logic, whereas, in GCTRL 105A, the signals DDCK and MDCK are processed by OR logic.

Figure 3:
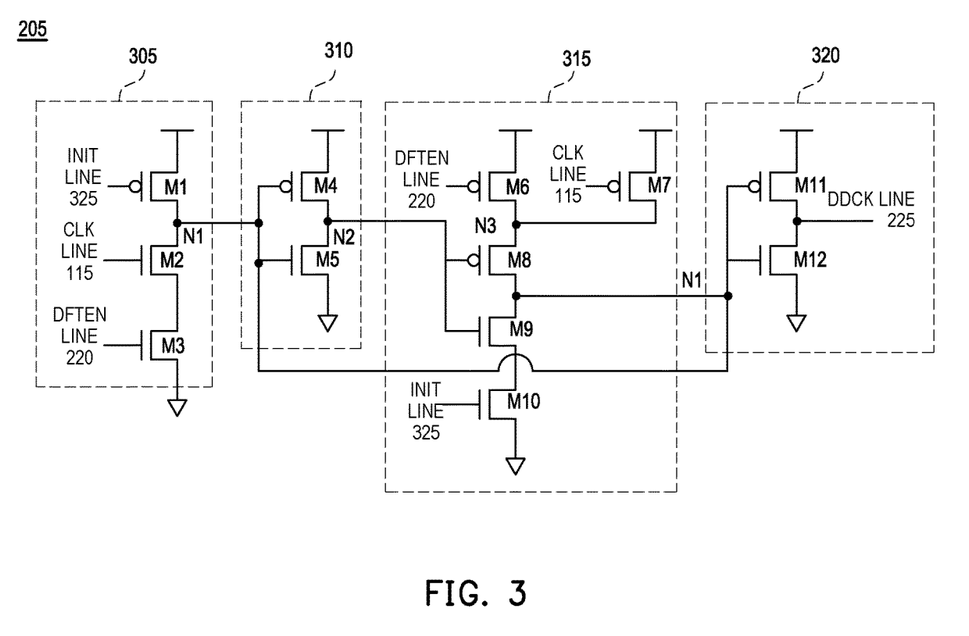
FIG. 3 illustrates a circuit diagram of a design for testability (DFT) mode clock (DDCK) generator (DFT_CLK), in accordance with some embodiments of the present disclosure.

FIG. 3 illustrates a circuit diagram of the DDCK generator (DFT_CLK) 205, in accordance with some embodiments of the present disclosure. The DFT_CLK 205 includes circuit 305, circuit 310, circuit 315, and circuit 320. The circuit 305 can be described as performing a NAND of CLK and DFTEN. The circuit 305 includes a transistor M1, a transistor M2, and a transistor M3. The gate of M1 is coupled to an INIT line 325 and the source of M1 is coupled to a first voltage rail line. The INIT line 325 provides an initialization (INIT) signal. In some embodiments, the INIT signal is in a first logic state when the memory system 100 is powered on, the power-up circuits are enabled, the pulse width control circuits are enabled, DFT is enabled, clock is high, or a combination thereof. In some embodiments, the first logic state is the high logic state. In some embodiments, the INIT signal is a result of an AND operation of CLK and DFTEN. The first voltage rail line may be a supply voltage line that receives supply voltage (e.g., 1V or a voltage of any positive value). The gate of M2 is coupled to the CLK line 115 and the drain of M2 is coupled to the drain of M1, which can be referred to as node N1. The gate of M3 is coupled to the DFTEN line 220, the drain of M3 is coupled to the source of M2, and the source of M3 is coupled to a second voltage rail line. The second voltage rail line may be a ground line (e.g., 0V).

The circuit 310 includes a transistor M4 and a transistor M5. The circuit 310 can be described as an inverter. The gate of M4 is coupled to the node N1 and the source of M4 is coupled to the first voltage rail line. The gate of M5 is coupled to the node N1, the drain of M5 is coupled to the drain of M4, which may be referred to as node N2, and the source of M5 is coupled to the second voltage rail line.

The circuit 315 includes a transistor M6, a transistor M7, a transistor M8, a transistor M9, and a transistor M10. The circuit 315 can be described as performing a NAND operation on DFTEN and CLK. The gate of M6 is coupled to the DFTEN line 220 and the source of M6 is coupled to the first voltage rail line. The gate of M7 is coupled to the CLK line 115, the source of M7 is coupled to the first voltage rail line, and the drain of M7 is coupled to the drain of 2 M6, which may be referred to as node N3. The gate of M8 is coupled to the node N2, the source of M8 is coupled to the node N3, and the drain of M8 is coupled to the node N1. The gate of M9 is coupled to the node N2 and the drain of M9 is coupled to the node N1. The gate of M10 is coupled to the INIT line 325, the drain of M10 is coupled to the source of M9, and the source of M10 is coupled to the second voltage rail line.

The circuit 320 includes a transistor M11 and a transistor M12. The circuit 320 can be described as an inverter. The gate of M11 is coupled to the node N1, the source of M11 is coupled to the first voltage rail line, and the drain is coupled to the DDCK line 225. The gate of M12 is coupled to the node N1, the drain is coupled to the DDCK line 225, and the source of M12 is coupled to the second voltage rail line.

In operation, the blocks 305-320 and transistors M1-M12 operate in accordance with the inputs INIT, CLK, and DFTEN to generate a corresponding DDCK. An example operation is described for INIT=1, CLK=1, DFTEN=1, which generates DDCK=1. Block 305 receives inputs INIT, CLK, and DFTEN at respective transistors M1, M2, and M3. In response to INIT=1, M1 is turned off. In response to CLK=1, M2 is turned on. In response to DFTEN=1, M3 is turned on. Thus, the signal at node N1=0 because it is coupled to ground through transistors M2 and M3.

Block 310 receives the signal at N1 from block 305. In response to the signal at N1=0, M4 is turned on and M5 is turned off. Thus, the signal at node N2=1 because N2 is coupled to the power supply through the transistor M4.

Block 315 receives inputs INIT, CLK, and DFTEN at respective transistors M10, M7, and M6. Block 315 receives the signal at N2 from block 310 at transistors M8 and M9. In response to INIT=1, M10 is turned on. In response to CLK=1, M7 is turned off. In response to DFTEN=1, M6 is turned off. In response to the signal at N2=1, M8 is turned off and M9 is turned on. Thus, the signal at node N1=0 because N1 is coupled to the ground through transistors M9 and M10 (and also coupled to the ground through transistors M2 and M3 of block 305).

Block 320 receives the signal at N1 from blocks 305 and 315. In response to the signal at N1=0, M11 is turned on and M12 is turned off. Thus, DDCK=1 because the DDCK line 225 is coupled to the power supply through the transistor M11.

An exemplary table for operation of DFT_CLK 205 is shown below in table 3:

TABLE 3

| INIT | CLK | DFTEN | DDCK |
|---|---|---|---|
| 0 | 0 | 0 | 0 |
| 0 | 0 | 1 | 0 |
| 0 | 1 | 0 | 0 |
| 1 | 1 | 1 | 1 |

More generally, in response to a voltage of the INIT signal being below a first threshold, the drain of M1 couples to the source of M1 via a conduction channel. In response to the voltage of the INIT signal being above the first threshold, the drain of M1 decouples from the source of M1 via a conduction channel. In response to a voltage of the CLK signal being above a second threshold, the drain of M2 couples to the source of M2 via a conduction channel. In response to the voltage of the CLK signal being below the second threshold, the drain of M2 decouples from the source of M2 via a conduction channel. In response to a voltage of the DFTEN signal being above a third threshold, the drain of M3 couples to the source of M3 via a conduction channel. In response to the voltage of the DFTEN signal being below the third threshold, the drain of M3 decouples from the source of M3 via a conduction channel.

In response to a voltage of the N1 node being below a fourth threshold, the drain of M4 couples to the source of M4 via a conduction channel. In response to the voltage of the N1 node being above the fourth threshold, the drain of M4 decouples from the source of M4 via a conduction channel. In response to a voltage of the N1 node being above a fifth threshold, the drain of M5 couples to the source of M5 via a conduction channel. In response to the voltage of the N1 node being below the fifth threshold, the drain of M5 decouples from the source of M5 via a conduction channel. In response to a voltage of the DFTEN signal being below a sixth threshold, the drain of M6 couples to the source of M6 via a conduction channel. In response to the voltage of the DFTEN signal being above the sixth threshold, the drain of M6 decouples from the source of M6 via a conduction channel.

In response to a voltage of the CLK signal being below a seventh threshold, the drain of M7 couples to the source of M7 via a conduction channel. In response to the voltage of the CLK signal being above the seventh threshold, the drain of M7 decouples from the source of M7 via a conduction channel. In response to a voltage of the N2 node being below a eighth threshold, the drain of M8 couples to the source of M8 via a conduction channel. In response to the voltage of the N2 node being above the eighth threshold, the drain of M8 decouples from the source of M8 via a conduction channel. In response to a voltage of the N2 node being above a ninth threshold, the drain of M9 couples to the source of M9 via a conduction channel. In response to the voltage of the N2 node being below the ninth threshold, the drain of M9 decouples from the source of M9 via a conduction channel.

In response to a voltage of the INIT signal being above a tenth threshold, the drain of M10 couples to the source of M10 via a conduction channel. In response to the voltage of the INIT signal being below the tenth threshold, the drain of M10 decouples from the source of M10 via a conduction channel. In response to a voltage of the N1 node being below a eleventh threshold, the drain of M11 couples to the source of M11 via a conduction channel. In response to the voltage of the N1 node being above the eleventh threshold, the drain of M11 decouples from the source of M11 via a conduction channel. In response to a voltage of the N1 node being above a twelfth threshold, the drain of M12 couples to the source of M12 via a conduction channel. In response to the voltage of the N1 node being below the twelfth threshold, the drain of M12 decouples from the source of M12 via a conduction channel.

In response to the drain of M11 coupling to the source of M11 and the drain of M12 decoupling from the source of M12, the DDCK line is coupled to the source of M11, which is coupled to the voltage supply line. In response to the drain of M11 decoupling from the source of M11 and the drain of M12 coupling to the source of M12, the DDCK line is coupled to the source of M12, which is coupled to the ground line.

A number of the transistors can be a metal-oxide semiconductor field-effect transistor (MOSFET), an n-type MOSFET (an NMOS transistor), a p-type MOSFET (a PMOS transistor), a silicon-on-insulate (SOI) MOSFET, a bipolar junction transistor (BJT), any other transistor suitable for use in memory structures, or a combination thereof. For example, M1, M4, M6, M7, M8, and M11 are PMOS transistors, and M2, M3, M5, M9, M10, and M12 are NMOS transistors, although other transistor selections are within the scope of the present disclosure. An NMOS transistor can be chosen for a number of the transistors for applications where speed is a concern because, in some embodiments, read and write operations are faster using an NMOS transistor than using a PMOS transistor. Specifically, in some embodiments, the mobility of electrons, which are carriers in the case of an NMOS transistor, is about two times greater than that of holes, which are the carriers of the PMOS transistor. A PMOS transistor can be chosen for a number of the transistors for applications where variation, cost, or noise is a concern because, in some embodiments, PMOS technology is highly controllable, low-cost process with good yield and high noise immunity as compared to NMOS technology.

A number of the transistors can be any of various transistor types while remaining within the scope of the present disclosure. A number of the transistors can have a MOSFET device type of standard threshold voltage (SVT), low threshold voltage (LVT), high threshold voltage (HVT), high voltage (HV), input/output (IO), or any of various other MOS device types.

Figure 4:
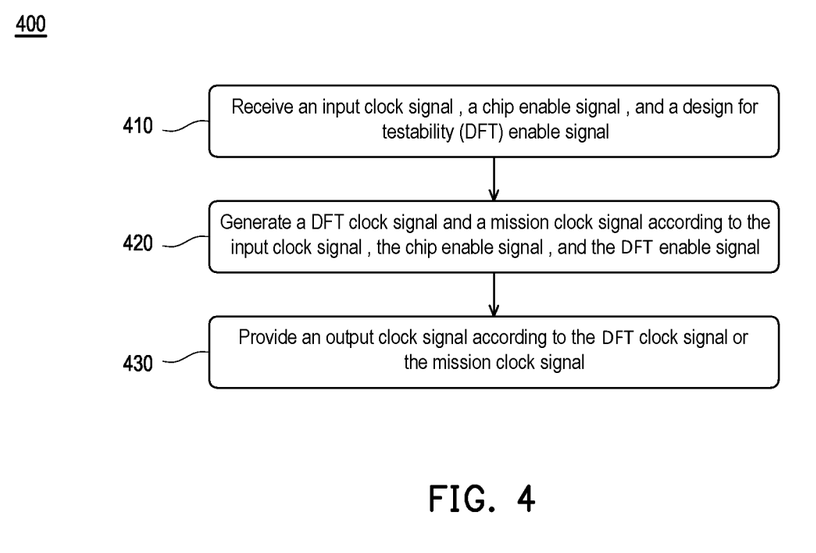
FIG. 4 illustrates a flowchart of a method to operate a global control circuit, in accordance with some embodiments of the present disclosure.

FIG. 4 illustrates a flowchart of a method 400 to operate the global control circuit 105, in accordance with some embodiments of the present disclosure. It is noted that the method 400 is merely an example and is not intended to limit the present disclosure. Accordingly, it is understood that additional, fewer, or different operations may be in the method 400 of FIG. 4, additional operations provided before, during, and after the method 400 of FIG. 4, and that some other operations may only be briefly described herein. In some embodiments, the method 400 is performed by the global control circuit 105.

At operation 410, the global control circuit (e.g., GCTRL 105) receives an input clock signal (e.g., CLK signal via CLK line 115), a chip enable (e.g., low-active) signal (e.g., CE signal via CEB line 110), and one or more DFT mode input signals (e.g., one or more of SE signal via SE line 120, DFTBYP signal via DFTBYP line 125, or DFTEN signal via DFTEN line 238) signal. At operation 420, the global control circuit generates a DDCK signal (e.g., DDCK signal via DDCK line 225) and a mission clock signal (e.g., MDCK signal via MDCK line 230) according to the CLK signal, the CE signal, and the one or more DFT mode input signals. At operation 430, the global control circuit provides an output clock signal (e.g., DCK signal via DCK line 140) according to the DDCK signal or the MDCK signal. In some embodiments, the global control circuit provides an DCK signal according to the DDCK signal and the MDCK signal In some embodiments, in response to a DFT mode input signal being in a high logic state, the DCK signal follows the DDCK signal. In some embodiments, in response to the DFT mode input signal being in a low logic state, the DCK signal follows the MDCK signal.

In some aspects of the present disclosure, a memory device is disclosed. In some aspects, the memory device includes a plurality of memory cells arranged in an array, an input/output (I/O) interface connected to the plurality of memory cells to output data signal from each memory cell, and a control circuit. In some embodiments, the control circuit includes a first clock generator to generate a first clock signal and a second clock signal according to an CLK signal and a CE signal and provide the first clock signal to the plurality of memory cells. In some embodiments, the control circuit includes a second clock generator to generate a third clock signal according to the CLK signal and a design for testability (DFT) enable (DFTEN) signal. In some embodiments, the control circuit generates an DCK signal according to the second clock signal or the third clock signal.

In some embodiments, the control circuit performs a logic OR operation on the second clock signal and the third clock signal to generate the DCK signal. In some embodiments, the DFTEN signal is generated by performing a logic OR operation on a scan enable (SE) signal and a DFT bypass (DFTBYP) signal.

In some embodiments, in response to the DFTEN signal being in a high logic state, the memory device is in a DFT mode, and the DCK signal generated by the control circuit follows the third clock signal. In some embodiments, in response to the DFTEN signal being in a low logic state, the DCK signal generated by the control circuit follows the second clock signal.

In some embodiments, the control circuit performs a logic NOR on the second clock signal and the third clock signal to generate a fourth clock signal, and the fourth clock signal passes through an inverter to generate the DCK signal. In some embodiments, the second clock signal passes through a first inverter to generate a fourth clock signal, the third clock signal passes through a second inverter to generate a fifth clock signal, and the control circuit performs a logic NAND on the fourth clock signal and the fifth clock signal to generate the DCK signal.

In some embodiments, the second clock generator provides a buffered DFTEN signal to the first clock generator. In some embodiments, the second clock generator generates the third clock signal according to the CLK signal, the DFTEN signal, and an initialization (INIT) signal. In some embodiments, a distance between the control circuit and each of the plurality of memory cells and the I/O interface is greater than 10 microns.

In some aspects of the present disclosure, a control circuit is disclosed. In some embodiments, the control circuit includes a first clock generator to generate a mission mode clock (MDCK) signal according to an input clock signal and a chip enable (CE) signal. In some embodiments, the control circuit includes a second clock generator to generate a design for testability (DFT) mode clock (DDCK) signal according to the input clock signal and a DFT enable (DFTEN) signal. In some embodiments, the control circuit includes a logic gate to generate an output clock signal according to the MDCK signal or the DDCK signal.

In some embodiments, the control circuit performs a logic OR operation on the MDCK signal and the DDCK signal to generate the output clock signal. In some embodiments, the DFTEN signal is generated by performing a logic OR operation on a scan enable (SE) signal and a DFT bypass (DFTBYP) signal.

In some embodiments, in response to the DFTEN signal being in a high logic state, the output clock signal generated by the logic gate is according to the DDCK signal. In some embodiments, in response to the DFTEN signal being in a low logic state, the output clock signal generated by the logic gate is according to the MDCK signal.

In some embodiments, the control circuit performs a logic NOR on the MDCK signal and the DDCK signal to generate a first clock signal, and the first clock signal passes through an inverter to generate the output clock signal. In some embodiments, the MDCK signal passes through a first inverter to generate a first clock signal, the DDCK signal passes through a second inverter to generate a second clock signal, and the control circuit performs a logic NAND on the first clock signal and the second clock signal to generate the output clock signal.

In some embodiments, the second clock generator provides a buffered DFTEN signal to the first clock generator. In some embodiments, the second clock generator generates the DDCK signal according to the input clock signal, the DFTEN signal, and an initialization (INIT) signal. In some embodiments, the first clock generator the first clock generator generates a global clock (GCK) signal according to the input clock signal and the chip enable (CE) signal and provide the GCK signal to a plurality of memory cells.

In some aspects of the present disclosure, a method is disclosed. In some embodiments, the method includes receiving an input clock signal, a chip enable signal, and a design for testability (DFT) enable (DFTEN) signal. In some embodiments, the method includes generating a DFT mode clock (DDCK) signal and a mission mode clock (MDCK) signal according to the input clock signal, the chip enable signal, and the DFTEN signal. In some embodiments, the method includes providing an output clock signal according to the DDCK signal or the MDCK signal.

In some embodiments, in response to the DFTEN signal being in a high logic state, the output clock signal follows the DDCK signal. In some embodiments, in response to the DFTEN signal being in a low logic state, the output clock signal follows the MDCK signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A control circuit, comprising:
a first clock generator configured to generate a mission mode clock (MDCK) signal according to an input clock signal and a chip enable (CE) signal; and
a second clock generator configured to generate a design for testability (DFT) mode clock (DDCK) signal according to the input clock signal and provide the first clock generator with a DFT enable (DFTEN) signal;
wherein in response to the DFTEN signal being in a high logic state, an output clock signal, provided by the control circuit, follows the DDCK signal, and in response to the DFTEN signal being in a low logic state, the output clock signal follows the MDCK signal.

2. The control circuit of claim 1, further comprising a logic gate configured to perform a logic OR operation on the MDCK signal and the DDCK signal to generate the output clock signal.

3. The control circuit of claim 1, wherein the DFTEN signal is generated by performing a logic OR operation on a scan enable (SE) signal and a DFT bypass (DFTBYP) signal.

4. The control circuit of claim 1, further comprising a logic gate configured to perform a logic NOR on the MDCK signal and the DDCK signal to generate a first clock signal, and the first clock signal passes through an inverter to generate the output clock signal.

5. The control circuit of claim 1, wherein the MDCK signal passes through a first inverter to generate a first clock signal, the DDCK signal passes through a second inverter to generate a second clock signal, and the control circuit performs a logic NAND on the first clock signal and the second clock signal to generate the output clock signal.

6. The control circuit of claim 1, wherein the second clock generator provides a buffered DFTEN signal to the first clock generator.

7. The control circuit of claim 1, wherein the second clock generator generates the DDCK signal according to the input clock signal, the DFTEN signal, and an initialization (INIT) signal.

8. The control circuit of claim 1, wherein the first clock generator generates a global clock (GCK) signal according to the input clock signal and the chip enable (CE) signal, and provide the GCK signal to a plurality of memory cells.

9. A memory device, comprising:
a plurality of memory cells arranged in an array;
an input/output (I/O) interface, connected to the plurality of memory cells to output data signal from each memory cell; and
a control circuit, comprising:
a first clock generator configured to generate a mission mode clock (MDCK) signal according to an input clock signal and a chip enable (CE) signal; and
a second clock generator configured to generate a design for testability (DFT) mode clock (DDCK) signal according to the input clock signal and provide the first clock generator with a DFT enable (DFTEN) signal;
wherein in response to the DFTEN signal being in a high logic state, an output clock signal, provided by the control circuit, follows the DDCK signal, and in response to the DFTEN signal being in a low logic state, the output clock signal follows the MDCK signal.

10. The memory device of claim 9, further comprising a logic gate configured to perform a logic OR operation on the MDCK signal and the DDCK signal to generate the output clock signal.

11. The memory device of claim 9, wherein the DFTEN signal is generated by performing a logic OR operation on a scan enable (SE) signal and a DFT bypass (DFTBYP) signal.

12. The memory device of claim 9, wherein the control circuit is configured to perform a logic NOR on the MDCK signal and the DDCK signal to generate a first clock signal, and the first clock signal passes through an inverter to generate the output clock signal.

13. The memory device of claim 9, wherein the MDCK signal passes through a first inverter to generate a first clock signal, the DDCK signal passes through a second inverter to generate a second clock signal, and the control circuit performs a logic NAND on the first clock signal and the second clock signal to generate the output clock signal.

14. The memory device of claim 9, wherein the second clock generator provides a buffered DFTEN signal to the first clock generator.

15. The memory device of claim 9, wherein the second clock generator generates the DDCK signal according to the input clock signal, the DFTEN signal, and an initialization (INIT) signal.

16. The memory device of claim 9, wherein the first clock generator generates a global clock (GCK) signal according to the input clock signal and the chip enable (CE) signal, and provide the GCK signal to the plurality of memory cells.

17. A control circuit, comprising:
a first clock generator configured to generate a mission mode clock (MDCK) signal according to an input clock signal and a chip enable (CE) signal;
a second clock generator configured to generate a design for testability (DFT) mode clock (DDCK) signal according to the input clock signal and provide the first clock generator with a DFT enable (DFTEN) signal; and
a logic gate configured to generate an output clock signal based on the DDCK signal and the MDCK signal;
wherein in response to the DFTEN signal being in a high logic state, the output clock signal follows the DDCK signal, and in response to the DFTEN signal being in a low logic state, the output clock signal follows the MDCK signal.

18. The control circuit of claim 17, wherein the logic gate is configured to perform a logic OR operation on the MDCK signal and the DDCK signal to generate the output clock signal.

19. The control circuit of claim 17, wherein the logic gate is configured to perform a logic NOR operation on the MDCK signal and the DDCK signal to generate the output clock signal through an inverter.

20. The control circuit of claim 17, further comprising:
a first inverter configured to logically invert the MDCK signal; and
a second inverter configured to logically invert the DDCK signal;
wherein the logic gate is configured to perform a logic NAND operation on the inverted MDCK signal and the inverted DDCK signal to generate the output clock signal.

* * * * *